（12） United States Patent
Cho et al.

(10) Patent No.: US 7,212,585 B2
(45) Date of Patent: May 1, 2007

(54) QUADRATURE MODULATION TRANSMITTER (75) Inventors: Min-Hyung Cho, Daejon (KR);
Seung-Chul Lee, Daejon (KR);
Mun-Yang Park, Daejon (KR)

(73) Assignee: Electronics and Telecommunications Research Institute (KR)

( * ) Notice: Subject to any disclaimer, the term of this patent is extended or adjusted under 35 U.S.C. 154(b) by 725 days.

(21) Appl. No.: 10/734,574

(22) Filed: Dec. 12, 2003

(65) Prior Publication Data
US 2004/0125888 A1 Jul. 1, 2004

(30) Foreign Application Priority Data
Dec. 14, 2002 (KR) ................. 10-2002-0079924

(51) Int. Cl.
H04L 27/04 (2006.01)
H04L 27/20 (2006.01)
H04B 17/00 (2006.01)

(52) U.S. Cl. .............. 375/298; 375/295; 455/67.1; 332/104

(58) Field of Classification Search ............ 375/298, 375/295, 260, 261, 296, 297; 455/127.1, 455/76, 67.1; 322/104, 149
See application file for complete search history.

(56) References Cited
U.S. PATENT DOCUMENTS 6,240,142 B1 5/2001 Kaufman et al.
6,507,625 B2 1/2003 Iwamatsu et al.
2003/0118126 A1* 6/2003 Moon et al. ............. 375/298
2004/0146118 A1* 7/2004 Talwalkar et al. .......... 375/298
2004/0232985 A1* 11/2004 Itahara ..................... 330/149

OTHER PUBLICATIONS

A VLSI Architecture for a High-Speed All-Digital Quadrature Modulator and Demodulator fo rDigital Radio Applications, H. Samueli, et al., IEEE Journal , vol. 8, No. 8, Oct. 1990, pp. 1512-1519.
"A Digital Quadrature Modulator With On-Chip D/A Converter", J. Vankka, IEEE Journal of Solid-state Circuits, vol. 38, No. 10, Oct. 2003, pp. 1635-1642.

* cited by examiner

Primary Examiner—Khai Tran
(74) Attorney, Agent, or Firm—Blakely Sokoloff Taylor & Zafman (57) ABSTRACT There is provided a quadrature modulation transmitter which is capable of solving several problems of the conventional transmitter while performing the same function as the heterodyne transmitter or the digital IF transmitter, in which a circuit structure is simplified and a power consumption is reduced compared with the conventional transmitter. The quadrature modulation transmitter includes: a digital processing block for receiving an I-channel data, a Q-channel data and a clock signal, modulating the I-channel data or an inverted I-channel data into a first analog signal by means of an I-channel DAC according to a switching of an I-clock signal identical to the clock signal, and modulating the Q-channel data and an inverted Q-channel data into a second analog signal by means of a Q-channel DAC according to a switching of a Q-clock signal, the Q-clock signal being an inverted clock signal; and an analog processing block for receiving the first and second analog signals from the digital processing block, adding the first and second analog signals, converting the added signal into an RF domain signal through a mixing operation, and amplifying and transmitting the RF domain signal.

3 Claims, 13 Drawing Sheets

QUADRATURE MODULATION TRANSMITTER

FIELD OF THE INVENTION

The present invention relates to a quadrature modulation transmitter; and, more particularly, to a quadrature modulation transmitter which performs a quadrature modulation in a transmission block of a mobile communication system.

DESCRIPTION OF THE PRIOR ART

PCS, CDMA2000, GSM and WCDMA have been ever used as typical mobile communication systems. A structure of a transmission block used in these mobile communication systems is provided with a heterodyne system, a direct conversion system, a digital IF system, and the like. The heterodyne system has been used for a long time and is still used widely. Additionally, the direct conversion system and the digital IF system are recently used for remedying a demerit of the heterodyne system.

Figure 1:
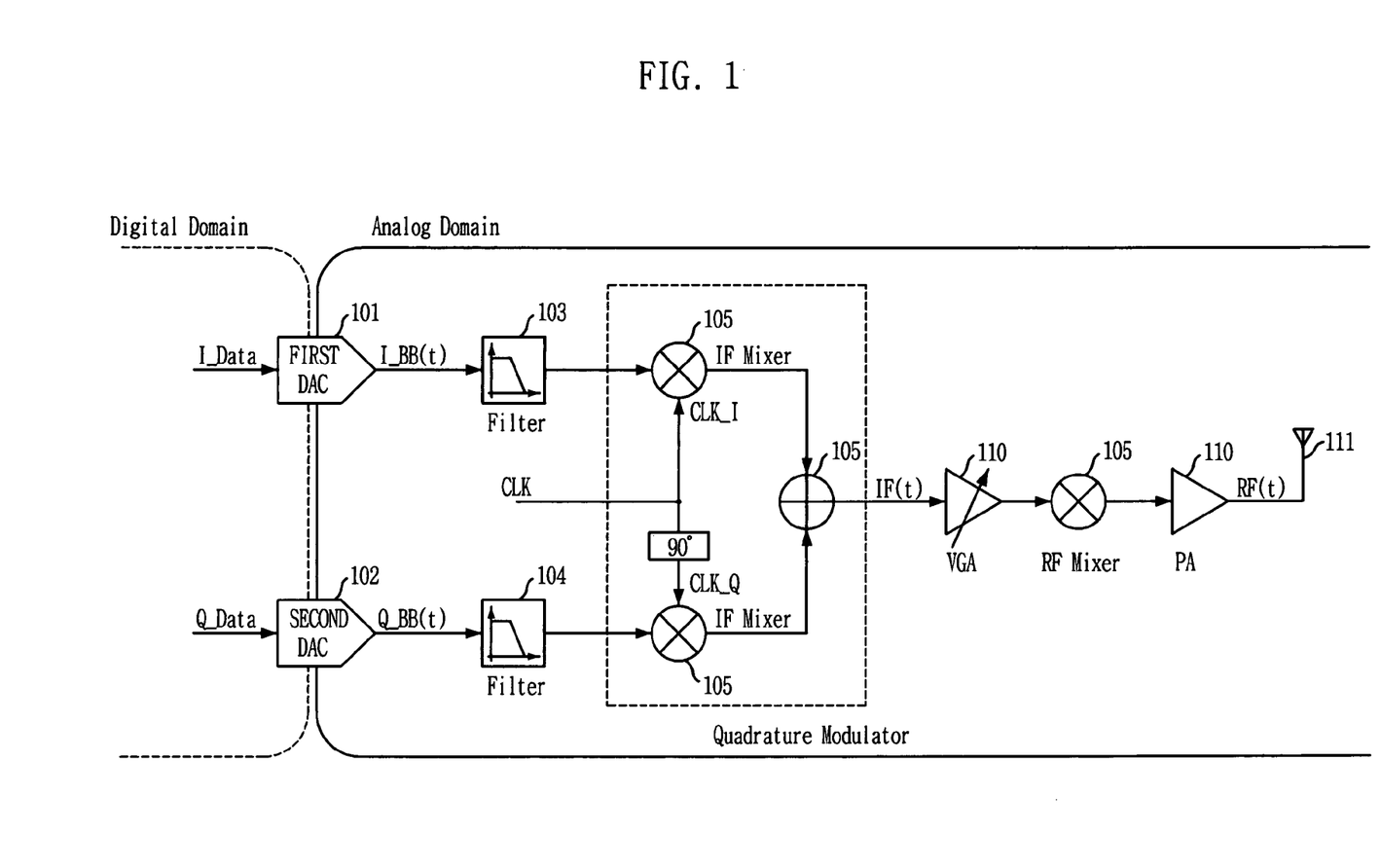
FIG. 1 is a block diagram showing a structure of a conventional heterodyne transmitter.

FIG. 1 is a block diagram showing a structure of a conventional heterodyne transmitter. The heterodyne transmitter is the most widely used structure in a mobile communication system. The conventional heterodyne transmitter includes: a first DAC 101 for receiving an I-channel data I_Data from a digital modem of a mobile communication system and converting the I-channel data I_Data into an analog data; a second DAC 102 for receiving a Q-channel data Q_Data from the modem of the mobile communication system and converting the Q-channel data Q_Data into an analog data; a first anti-aliasing filter 103 for filtering the analog data outputted from the first DAC 101; a second anti-aliasing filter 104 filtering the analog data outputted from the second DAC 102; a first IF mixer 105 for mixing the an output of the first anti-aliasing filter 103 and an I-clock CLK_I to generate an intermediate frequency signal; a second IF mixer 106 for mixing an output of the second anti-aliasing filter 104 and a Q-clock CLK_Q to generate an intermediate frequency signal, in which the Q-clock CLK_Q is a clock having a phase difference of 90 from the I-clock. CLK_I; an adder 107 for adding the outputs of the first and second IF mixers 105 and 106; a variable gain amplifier 108 for amplifying an output of the adder 107; an RF mixer 109 for performing a mixing operation to convert an output of the RF mixer 109 into an RF domain signal; a power amplifier 110 for amplifying an output of the RF mixer 109; and an antenna 111 for transmitting an output of the power amplifier 110 into air.

Herein, an operation of the heterodyne transmitter will be described below in detail.

First, the I-channel data I_Data and the Q-channel data Q_Data generated by the digital modem of the mobile communication system are converted into the analog signals through the DAC 101 and 102, respectively. The analog signals pass through the anti-aliasing filters 103 and 104 and are then converted into the intermediate frequency signals using the I-clock and the Q-clock, in which a phase difference between the I-clock and the Q-clock is 90°. Then, the intermediate frequency signals are added to each other. The added signal passes through the variable gain amplifier 108 and is then converted into the RF domain signal by means of the RF mixer 109. Finally, the RF domain signal passes through the power amplifier 110 and is then transmitted through the antenna 111.

The heterodyne transmitter is the most widely used structure because of several advantages as well as channel selectivity. However, since the circuit structure of the heterodyne transmitter is complicated, the power consumption is high and the number of parts used in an outside of the chip is increased. On the other hand, small-sized, lightweight, cheap and durable mobile communication terminal is gradually demanded in view of the low power consumption. Therefore, the heterodyne transmitter has a drawback in that a large number of parts are required and the power consumption is increased.

Figure 2:
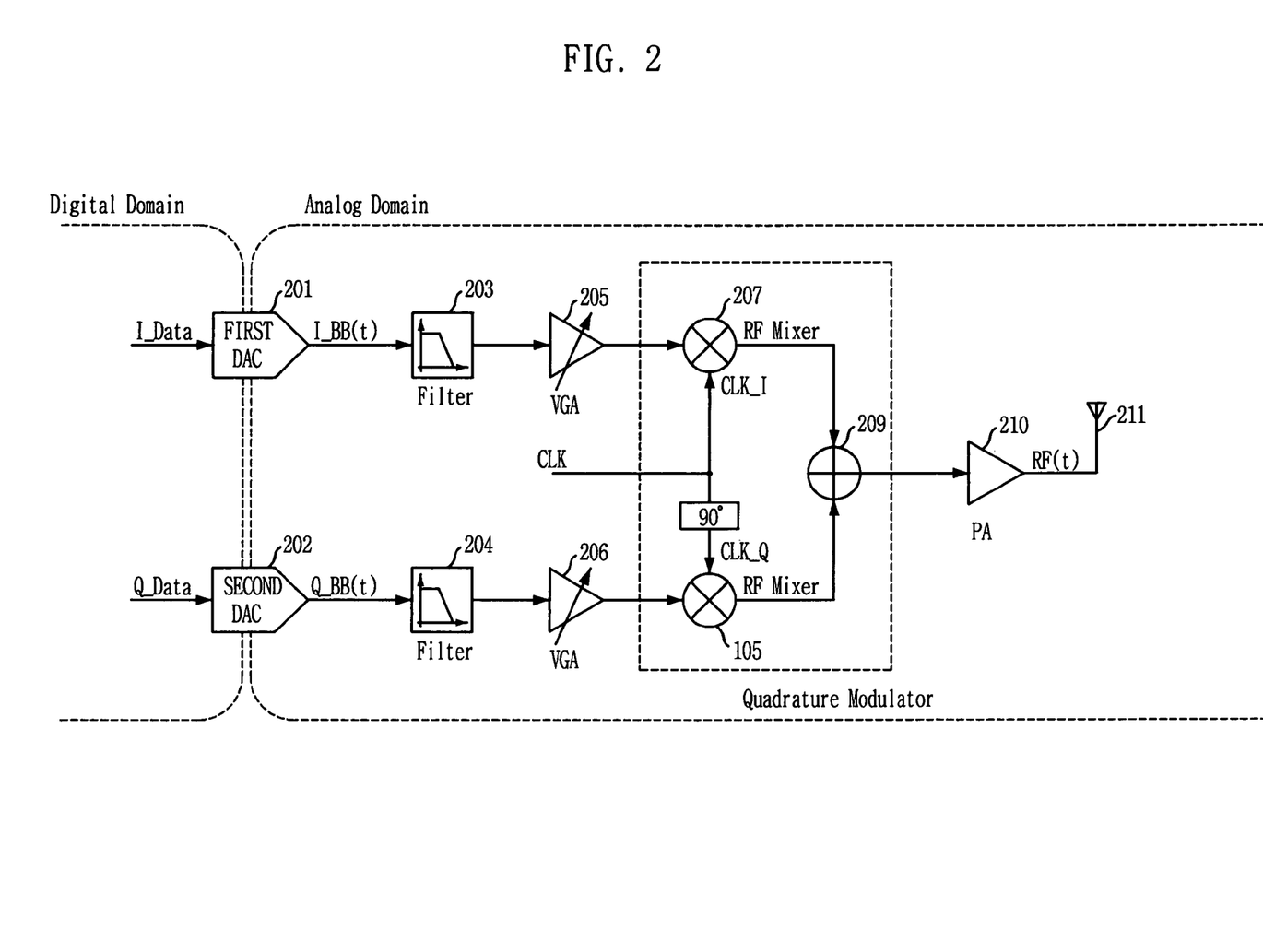
FIG. 2 is a block diagram showing a structure of a conventional direct conversion transmitter.

FIG. 2 is a block diagram of a conventional direct conversion transmitter. Unlike the heterodyne system, the conventional direct conversion transmitter directly converts a baseband signal into an RF signal. The direct conversion transmitter includes: a first DAC 201 for receiving an I-channel data I_Data from a digital modem of a mobile communication system and converting the I-channel data into an analog data; a second DAC 202 for receiving a Q-channel data Q_Data from the digital modem of the mobile communication system and converting the Q-channel data Q_Data into an analog data; and a first anti-aliasing filter 203 for filtering the analog data outputted from the first DAC 201; and a second anti-aliasing filter 204 for filtering the analog data outputted from the second DAC 202; a first variable gain amplifier 205 for amplifying an output of the first anti-aliasing filter 203; a second variable gain amplifier 206 for amplifying an output of the second anti-aliasing filter 204; a first RF mixer 207 for mixing an output of the first variable gain amplifier 205 and the I-clock CLK_I to generate an RF signal; a second RF mixer 208 for mixing an output of the second variable gain amplifier 206 and a Q-clock CLK_Q to generate an RF signal, in which the Q-clock is a clock having a phase difference of 90° from the I-clock CLK_I; an adder 209 for adding the outputs of the first and second RF mixers 207 and 208; a power amplifier 210 for amplifying an output of the adder 209; and an antenna 211 for transmitting an output of the power amplifier 210 into air.

Herein, a signal transmitting method of the direct conversion transmitter will be described below in detail.

First, the I-channel and Q-channel data generated by the digital modem of the mobile communication system are converted into the analog signals through the DAC 201 and 202, respectively. The analog signals pass through the anti-aliasing filters 203 and 204 and the baseband variable gain amplifiers 205 and 206. Then, the baseband signals are directly converted into the RF signals through the RF mixers 207 and 208, respectively. Accordingly, the IF mixers of the heterodyne transmitter are not used in the direct conversion transmitter. Since the operating frequency of the variable gain amplifier is lowered, the power consumption is reduced. Although the number of the variable gain amplifiers is two, a total amount of the power consumption is reduced.

However, the direct conversion transmitter has several problems, such as a DC offset and a generation of quadrature clocks in the RF frequency.

Figure 3:
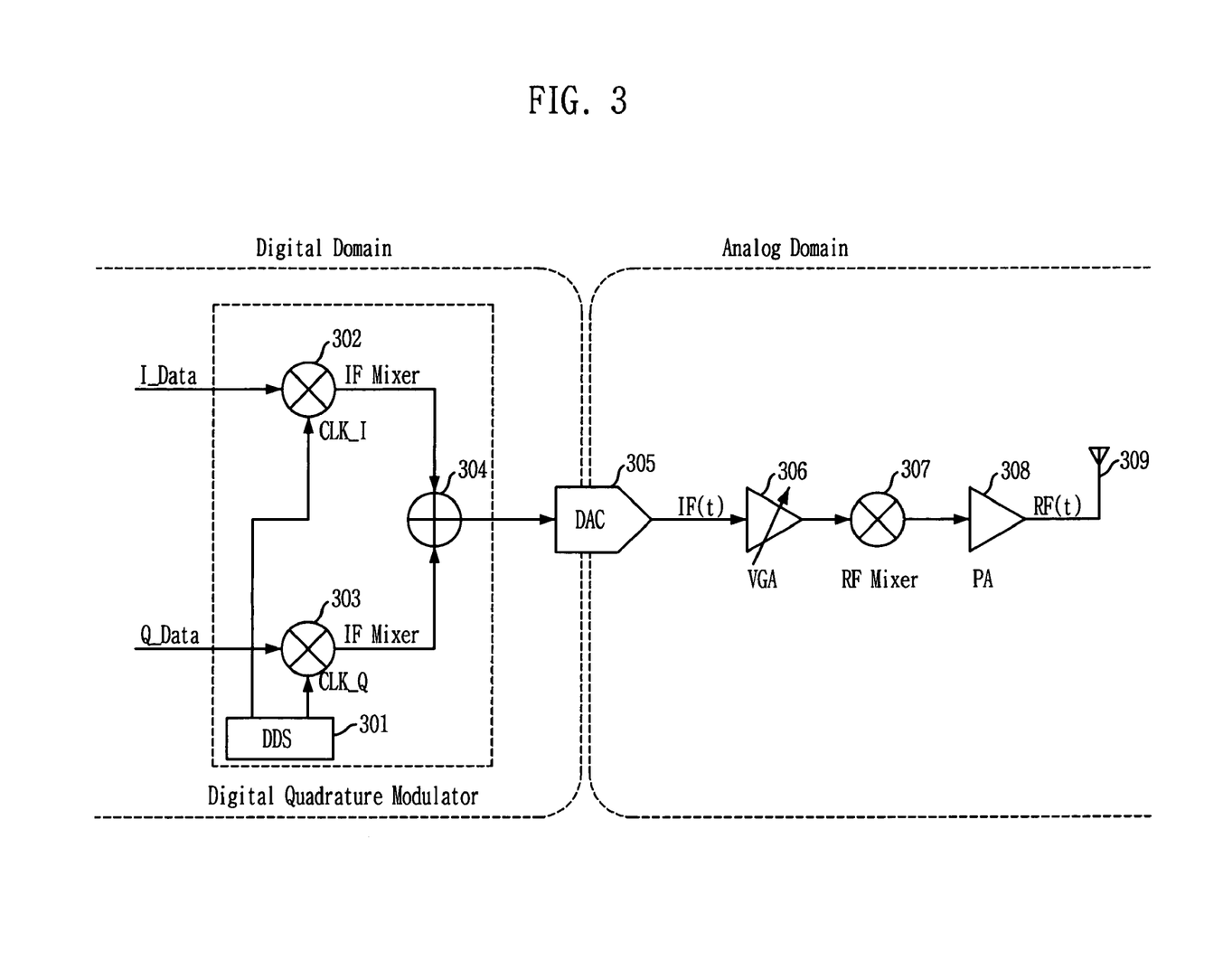
FIG. 3 is a block diagram showing a structure of a conventional digital IF transmitter.

FIG. 3 is a block diagram of a conventional digital IF transmitter. The conventional digital IF transmitter includes: a direct digital synthesis (DDS) 301 for generating an I-clock and a Q-clock; a first digital multiplier 302 for multiplying a filtered signal of I-channel data I_Data outputted from a digital modem and the I-clock outputted from the direct digital synthesis 301; a second digital multiplier 303 for multiplying a filtered signal of the Q-channel data Q_Data outputted from the digital modem and the Q-clock outputted from the direct digital synthesis 301; an adder 304 for adding outputs (intermediate frequency signals) of the first and second digital multiplier 302 and 303; a DAC 305 for converting a digital data of the adder 304 into an analog signal; a variable gain amplifier 306 for amplifying an output of the DAC 305; an RF mixer 307 for performing a mixing operation to convert an output of the variable gain amplifier into an RF domain signal; a power amplifier 308 for amplifying an output of the RF mixer 307; and an antenna 309 for transmitting an output of the power amplifier 308 into air.

The digital IF transmitter performs all quadrature modulation operations in a digital domain, which will be described below. The I-channel and Q-channel data generated by the digital modem pass through the digital anti-aliasing filters. The respective signals are converted into the intermediate frequency signals through the digital multipliers 302 and 303 of the respective channels. The I-clock and Q-clocks used herein are generated by the direct digital synthesis 301. The intermediate frequency digital signals of the I-channel and Q-channel are added to each other by the adder 304 and then converted into the analog signals through the DAC 305. Then, like the heterodyne transmitter, the analog signals are transmitted to the antenna 309 through the variable gain amplifier 306, the RF mixer 307 and the power amplifier 308.

In the digital IF transmitter, all signals including the baseband signal to the intermediate frequency signals are processed in the digital domain. Therefore, the problems occurring in the heterodyne transmitter, such as the gain mismatch and the phase mismatch between the I-channel and the Q-channel, do not occur. However, to processing of even the intermediate frequency signals in the digital domain is considerably complicated and digital circuits operating at a high speed are required. As a result, the power consumption of the digital IF transmitter is similar to that of the heterodyne transmitter and the implementation of the digital IF transmitter becomes considerably complicated in the digital signal processing domain.

SUMMARY OF THE INVENTION

It is, therefore, an object of the present invention to provide a quadrature modulation transmitter which is capable of solving several problems of the conventional transmitter while performing the same function as the heterodyne transmitter or the digital IF transmitter, in which a circuit structure is simplified and power consumption is reduced compared with the conventional structure.

In accordance with one aspect of the present invention, there is provided a quadrature modulation transmitter comprising: a digital processing block for receiving an I-channel data, a Q-channel data and a clock signal, modulating the I-channel data or an inverted I-channel data into a first analog signal by means of an I-channel DAC according to a switching of an I-clock signal identical to the clock signal, and modulating the Q-channel data and an inverted Q-channel data into a second analog signal by means of a Q-channel DAC according to a switching of a Q-clock signal, the Q-clock signal being an inverted clock signal; and an analog processing block for receiving the first and second analog signals from the digital processing block, adding the first and second analog signals, converting the added signal into an RF domain signal through a mixing operation, and amplifying and transmitting the RF domain signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, a detailed description of the preferred embodiments will be made with reference the accompanying drawings.

Figure 4:
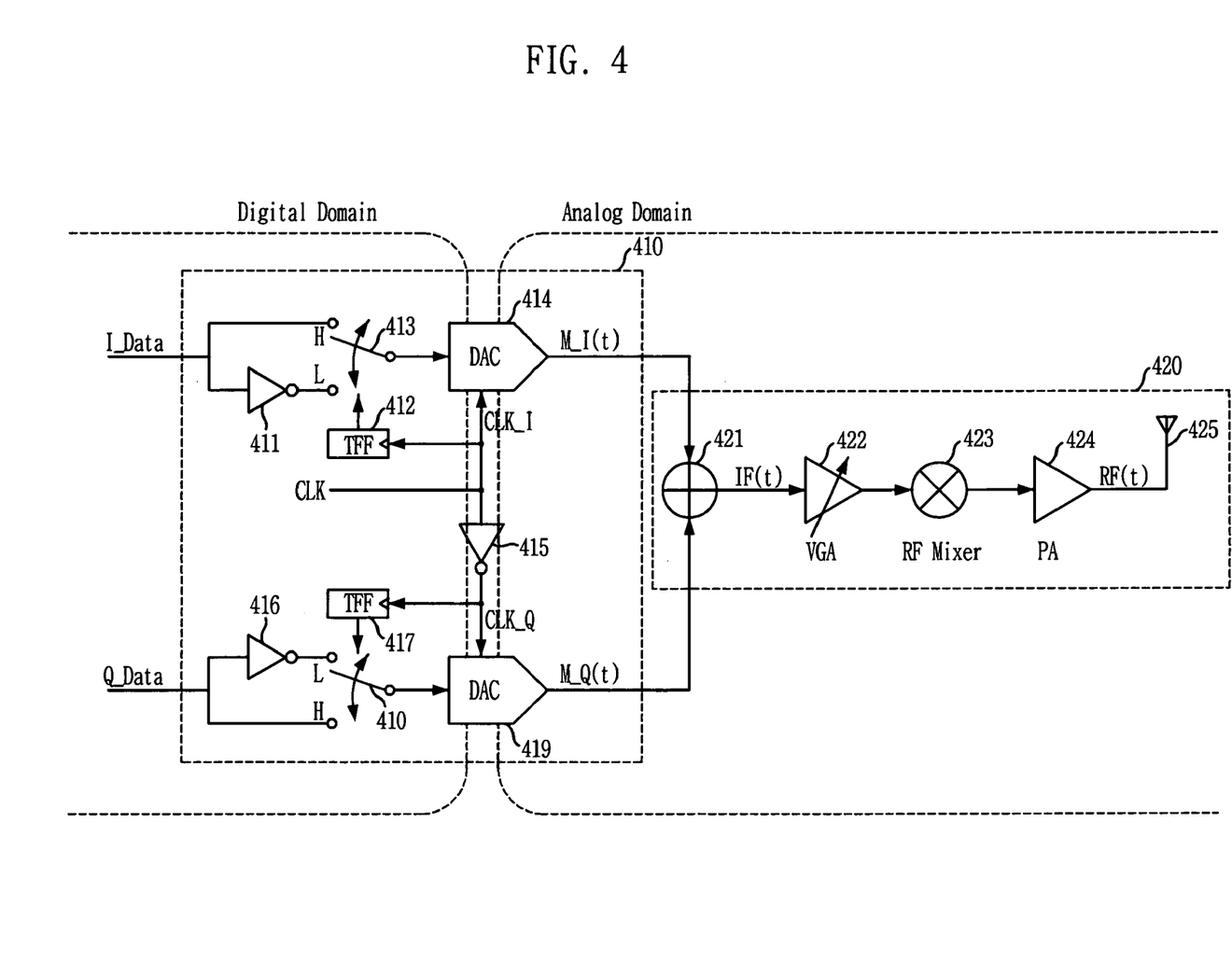
FIG. 4 is a block diagram of a quadrature modulation transmitter in accordance with an embodiment of the present invention.

FIG. 4 is a block diagram of a quadrature modulation transmitter including a digital processing block 410 and an analog processing block 420 in accordance with an embodiment of the present invention.

Referring to FIG. 4, the digital processing block 410 receives an I-channel data I_Data, a Q-channel data Q_Data and a clock signal CLK, modulates the I-channel data I_Data or an inverted I-channel data into a first analog signal according to a switching of an I-clock signal CLK_I that is a signal identical to the clock signal CLK, and modulates the Q-channel data Q_Data or an inverted Q-channel data into a second analog signal according to a switching of the Q-clock signal CLK_Q that is an inverted clock signal CLK. Hereinafter, the digital processing block 410 will be described in detail with reference to FIG. 4.

Referring to FIG. 4, a first inverter 411 inverts the I-channel data I_Data to output an inverted I-channel data.

A first T flip-flop 412 receives the I-clock signal CLK_I through a clock terminal and outputs a first switch control signal according to the I-clock signal CLK_I. As well known, the T flip-flop outputs an inverse value of the preceding output whenever a clock signal is inputted. That is, when the current output of the T flip-flop is in a 'high' state and a clock signal is inputted, the output of the T flip-flop is changed to a 'low' state. Then, if another clock signal is inputted, the output of the T flip-flop is changed to a 'high' state. In short, the operation of the T flip-flop shows a toggle phenomenon.

Meanwhile, in case the output of the first T flip-flop is in the first logic level "L", a first switch 413 turns on the output of the first inverter 411, and in case the output of the first T flip-flop is in the second logic level "H", the first switch 413 turns on the I-channel data I_Data.

A first DAC 414 receives the I-clock signal CLK_I through a clock terminal to convert the signal inputted through the first switch 413 into an analog signal and simultaneously performs a modulation.

A second inverter 415 inverts the clock signal CLK to output the inverted signal as the Q-clock signal CLK_Q. A third inverter 416 inverts the Q-channel data Q_Data to output the inverted data.

A second T flip-flop 417 receives the Q-clock signal CLK_Q through a clock terminal and outputs a second switch control signal according to the Q-clock signal CLK_Q. As well known, the T flip-flop outputs an inverse value of the preceding output whenever a clock signal is inputted. That is, when the current output of the T flip-flop is in a 'high' state and a clock signal is inputted, the output of the T flip-flop is changed to a 'low' state. Then, if another clock signal is inputted, the output of the T flip-flop is changed to a 'high' state. In short, the operation of the T flip-flop shows a toggle phenomenon.

Meanwhile, in case the output of the second T flip-flop is in the first logic level "L", a second switch 418 turns on the output of the third inverter 416, and in case the output of the second T flip-flop is in the second logic level "H", the second switch 418 turns on the Q-channel data Q_Data.

A second DAC 419 receives the Q-clock signal CLK_Q through a clock terminal to convert the signal inputted through the second switch 418 into an analog signal and simultaneously performs a modulation.

In addition, the analog processing block 420 adds the first and second analog signals inputted from the digital processing block 410, converts the added signal into an RF domain signal through a mixing operation, and amplifies the RF domain signal and then transmits the amplified RF domain signal. Herein, an operation of the analog processing block 420 will be described in detail.

An adder 421 adds the first and second analog signals outputted from the digital processing block 410 to output an intermediate frequency signal IF(t).

A variable gain amplifier 422 amplifies an output of the adder 421 and an RF mixer 423 converts an output of the variable gain amplifier 422 into an RF domain signal through a mixing operation.

A power amplifier 424 amplifies an output of the RF mixer 423 and an antenna transmits an output of the power amplifier 424 into air.

Herein, differences between the quadrature modulation transmitter of FIG. 4 and the heterodyne transmitter of FIG. 1 will be described below. First, the quadrature modulation transmitter of the present invention has no quadrature modulator part consisting of the two IF mixer used in the heterodyne transmitter. Instead, the DACs 414 and 419 perform the function of the IF mixer. Further, the quadrature modulation transmitter of the present invention has no anti-aliasing filters used in the heterodyne system. Instead, the DACs 414 and 419 includes an additional circuit for the quadrature modulation. The additional circuit is provided with inverter arrays 411 and 416 for inverting the data generated by the modem, switch arrays 413 and 418 for selecting inverted data and non-inverted data, and T flip-flops 412 and 417. Since the quadrature modulation is performed directly in the DAC, not in the IF mixer, the structure of the quadrature modulation transmitter can be simplified. A power consumption of the additional circuit is very low compared with that of the IF mixer or the anti-aliasing filter. As a result, the quadrature modulation transmitter of the present invention can reduce the power consumption compared with the heterodyne transmitter.

Herein, differences between the quadrature modulation transmitter of FIG. 4 and the digital IF transmitter of FIG. 3 will be described below. The digital IF transmitter implements the quadrature modulator in a digital domain, in which the quadrature modulator is implemented with two IF mixers in the heterodyne system. In other words, the transmitter of FIG. 3 are provided with two digital multipliers, the adder, and a direct digital synthesis (DDS) for generating a signal corresponding to a clock having a phase difference of 90°. However, the digital multiplier is complicated and consumes a large amount of power for operation up to the intermediate frequency. Although the digital IF transmitter uses one DAC, the resolution of the DAC must be higher compared with the case that the DACs are separately used in the I-channel and the Q-channel. Therefore, considering the I-channel DAC 414 and the Q-channel DAC 419 used in the quadrature modulation transmitter in accordance with the present invention, the size and power consumption are not reduced. Accordingly; the quadrature modulation transmitter in accordance with the present invention has a simple structure and a low power consumption compared with the digital IF transmitter.

Hereinafter, an operation and implementation of the quadrature modulation transmitter in accordance with the present invention will be described in detail.

Figure 5A:
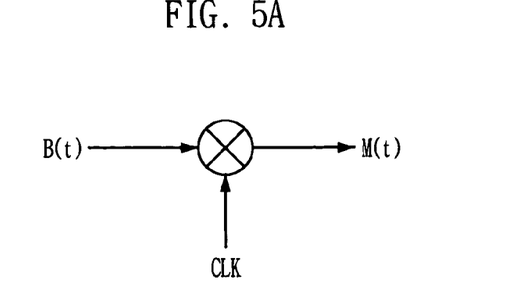
FIGS. 5A to 5C are exemplary diagrams illustrating an operation of a general analog mixer.
Figure 5B:
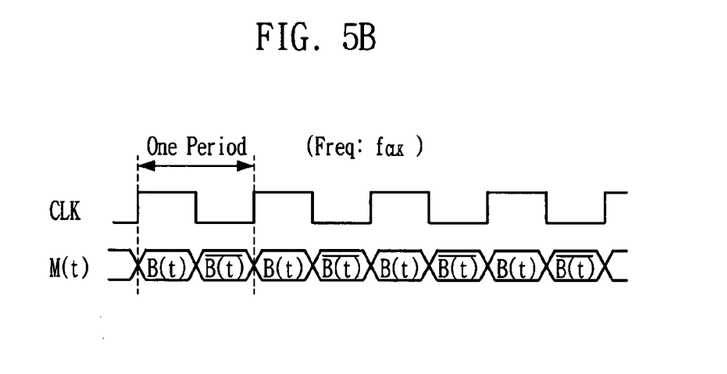
Figure 5C:
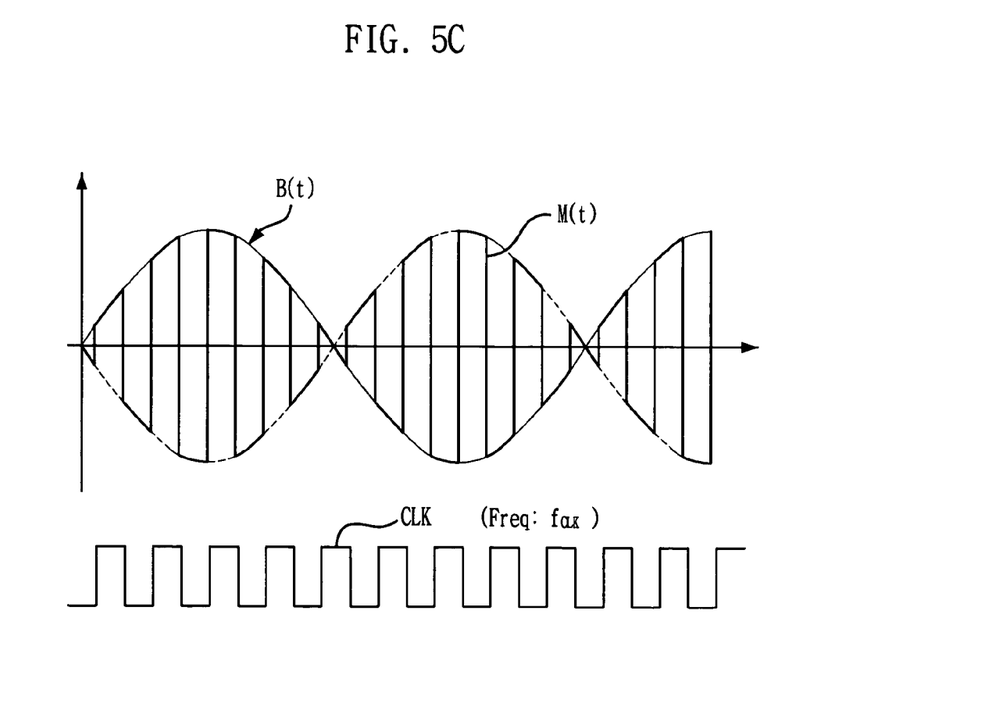

FIGS. 5A to 5C are exemplary diagrams illustrating an operation of the analog mixers 105 and 106. An operation of the analog mixer will be described with reference to FIG. 5.

In case the clock inputted to the analog mixer is in the second logic level "high", the input signal B(t) of the mixer is outputted as it is, and in case the input signal is in the first logic level "low", the inverted signal of the signal B(t) is outputted. In other words, the +/− input signals are alternately outputted according to the frequency of the clock, which is shown in FIG. 5B. A waveform of the actual output signal is generated in a form of M(t), as shown in FIG. 5C. In other words, the signal B(t) is modulated into the clock frequency $f_{CLK}$.

Figure 6A:
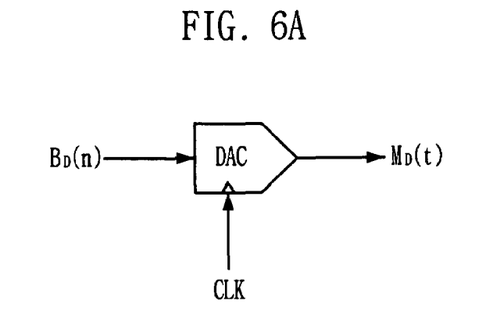
FIGS. 6A to 6C are exemplary diagrams illustrating a digital-to-analog conversion operation of a DAC.
Figure 6B:
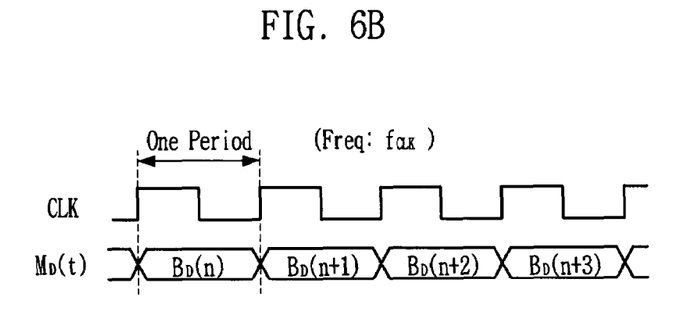
Figure 6C:
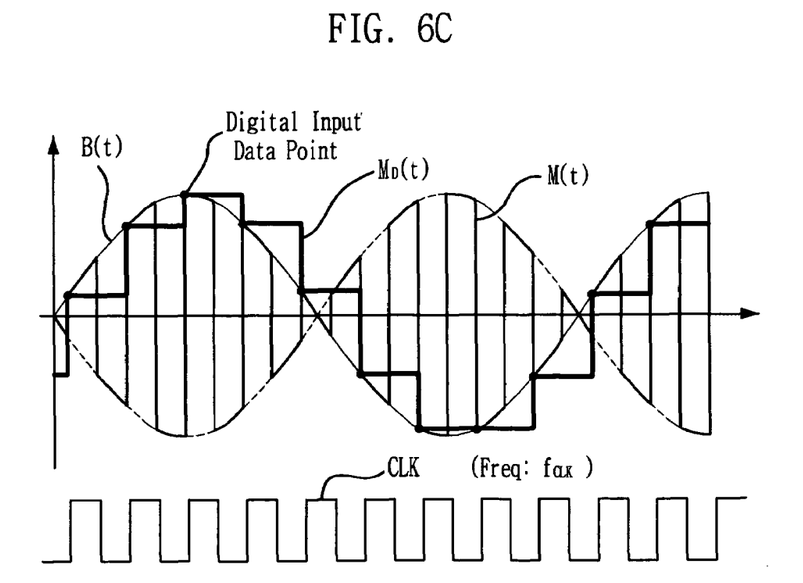

FIGS. 6A to 6C are exemplary diagrams illustrating a digital-to-analog conversion operation of the DACs 414 and 419. An operation of the digital-to-analog conversion will be described with reference to FIGS. 6A to 6C.

The DAC principally generates the analog output signals corresponding to the digital input values $B_D(n)$ at every clock. Accordingly, the actual output signal waveform of the DAC appears to be a step-shaped output signal waveform like $M_D(t)$ of FIG. 6C. If this signal passes through the filter, only the desired analog signal can be obtained.

Figure 7A:
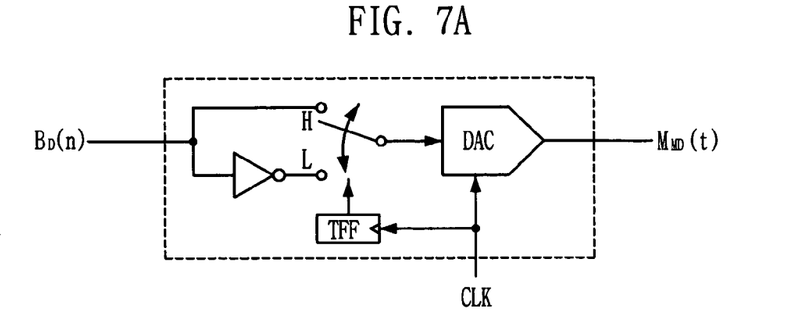
FIGS. 7A to 7C are exemplary diagrams illustrating an operation of a digital processing block in accordance with the present invention.
Figure 7B:
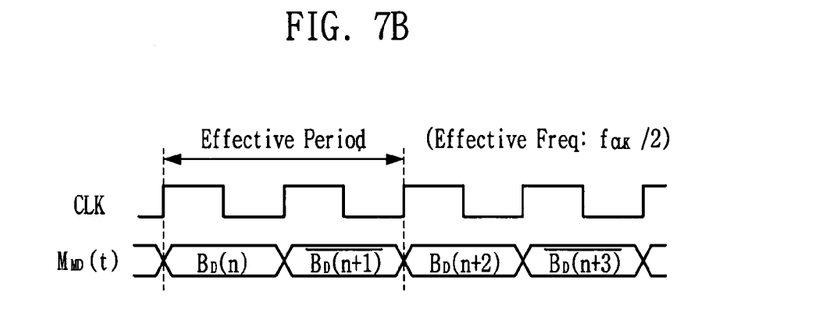
Figure 7C:
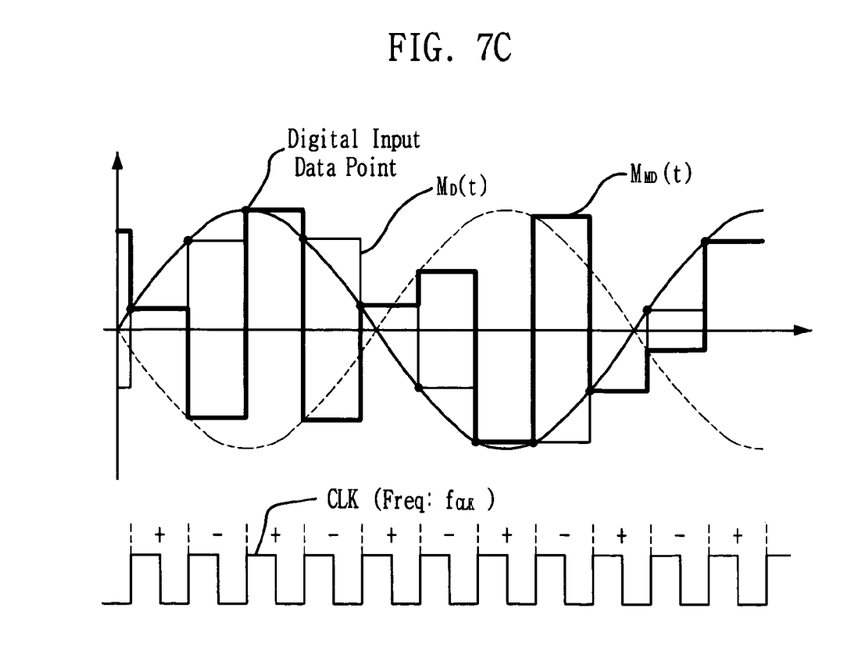

FIGS. 7A to 7C are exemplary diagrams illustrating an operation of the digital processing block 410 in accordance with the present invention. An operation of the digital processing block 410 will be described with reference to FIGS. 7A to 7C.

First, in case the digital input signal $B_D(n)$ of the DACs 414 and 419 is inverted at every two clocks, the DACs 414 and 419 outputs the original signal at a first clock and an inverted original signal at a next clock, so that an output signal is also inverted. If these operations continue to be repeated, the DAC configured as above generates the original output signal and the inverted signal alternately, just like the analog mixer. Referring to FIG. 7A, the digital data are applied to the DACs 414 and 419 with a normal input at a first time and with an inverted input at a next time according to the clocks. This overall structure is referred to as an "M-DAC". FIG. 7B conceptually shows the digital data that are inputted with a normal input at a first time and with an inverted input at a next time. FIG. 7C exemplarily shows an actual waveform of the M-DAC. It can be seen from FIG. 7C that an output of the M-DAC has a waveform equal to that of the analog mixer. In other words, the M-DAC provided by adding the inverters 411 and 416 and the switches 413 and 418 to the general DACs 414 and 419 can perform the digital-to-analog conversion and the frequency conversion at the same time. However, in case the M-DAC and the analog mixer operate along the clocks with the same frequency $f_{CLK}$, the analog mixer generates a signal that is obtained by modulating the frequency of the modulated output signal with the clock frequency $f_{CLK}$. In the case of the M-DAC, a signal modulated with the $f_{CLK}/2$ is outputted.

Figure 8A:
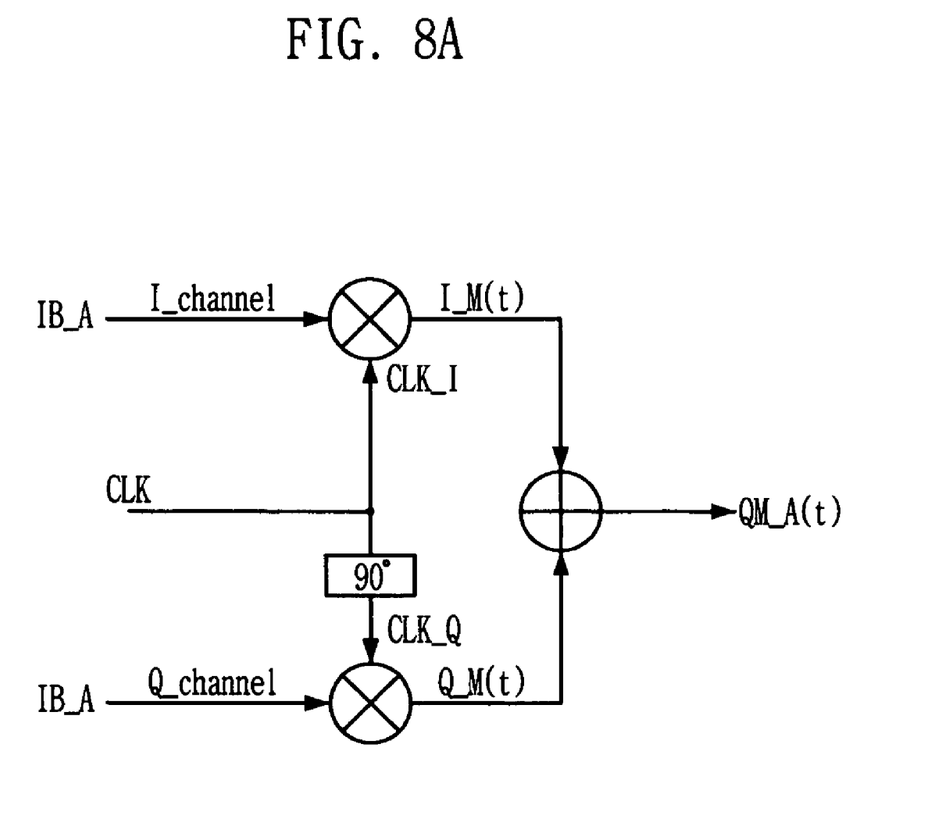
FIGS. 8A and 8B are exemplary diagrams illustrating an operation of a conventional analog quadrature modulator.
Figure 8B:
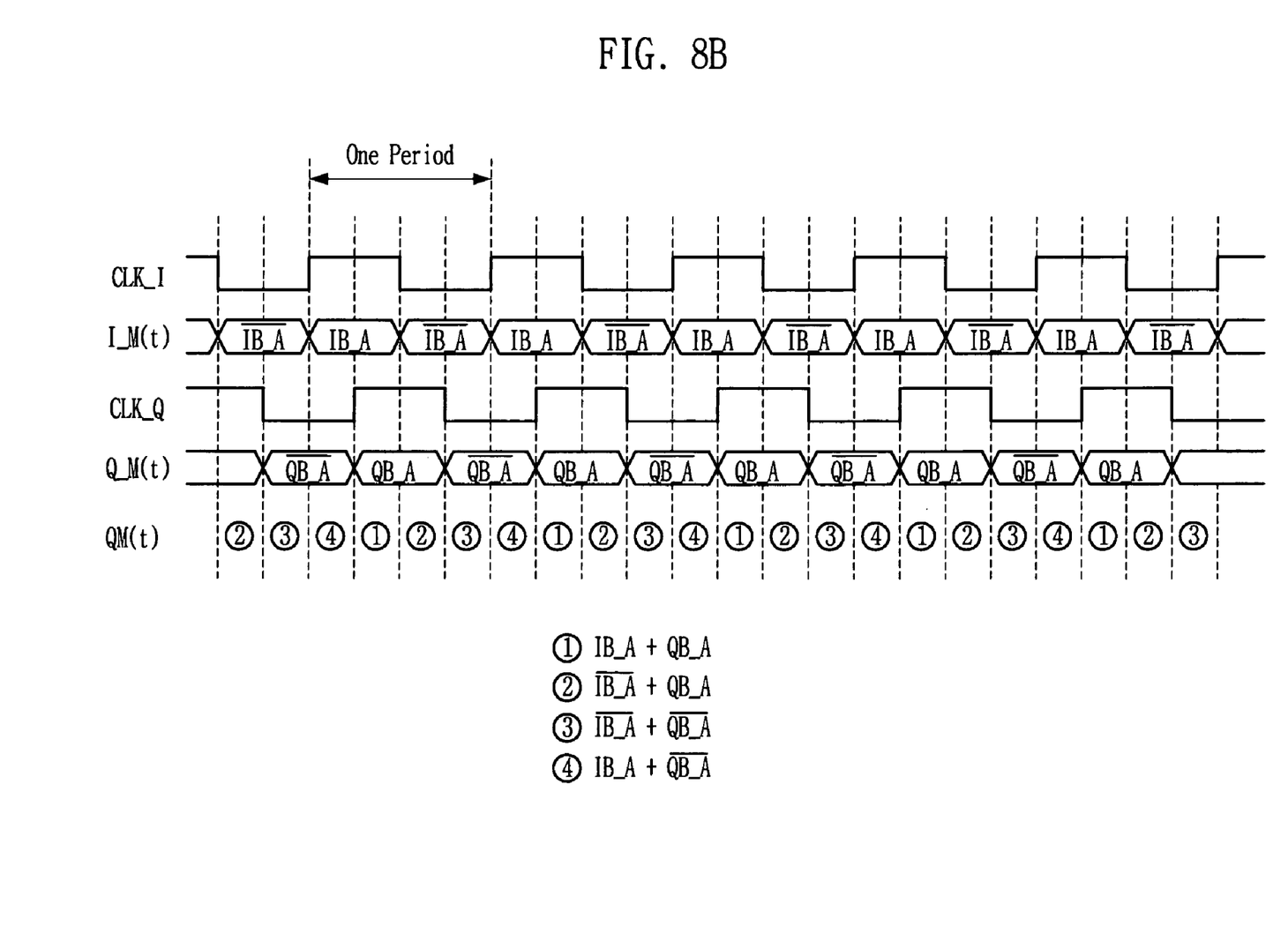

FIGS. 8A and 8B are exemplary diagrams illustrating an operation of the conventional analog quadrature modulator. An operation of the conventional analog quadrature modulator will be described with reference to FIGS. 8A and 8B.

Referring to FIG. 8B, the outputs of the I-channel and Q-channel mixers are equal to those of the analog mixer. As the clocks inputted to the I-channel and Q-channel mixers have the phase difference of 90°, the output of the two mixers are generated with the time delay corresponding to the phase difference of 90°. Accordingly, the analog quadrature modulator has four combined signals like a following equation 1 with respect to the input signals of the I-channel and the Q-channel and the four combined signals are outputted repeatedly.

(1) IB_A + QB_A  [Equation 1]

(2) $\overline{\text{IB\_A}}$ + QB_A (3) $\overline{\text{IB\_A}}$ + $\overline{\text{QB\_A}}$ (4) IB_A + $\overline{\text{QB\_A}}$ As described above, since the M-DAC operates like the analog mixer, the quadrature modulator using the M-DAC can be provided if the analog quadrature modulator of FIG. 8A is configured using the M-DAC. The quadrature modulator capable of performing the quadrature modulation and the digital-to-analog conversion at the same time and the operation thereof are shown in FIGS. 9A and 9B.

Figure 9A:
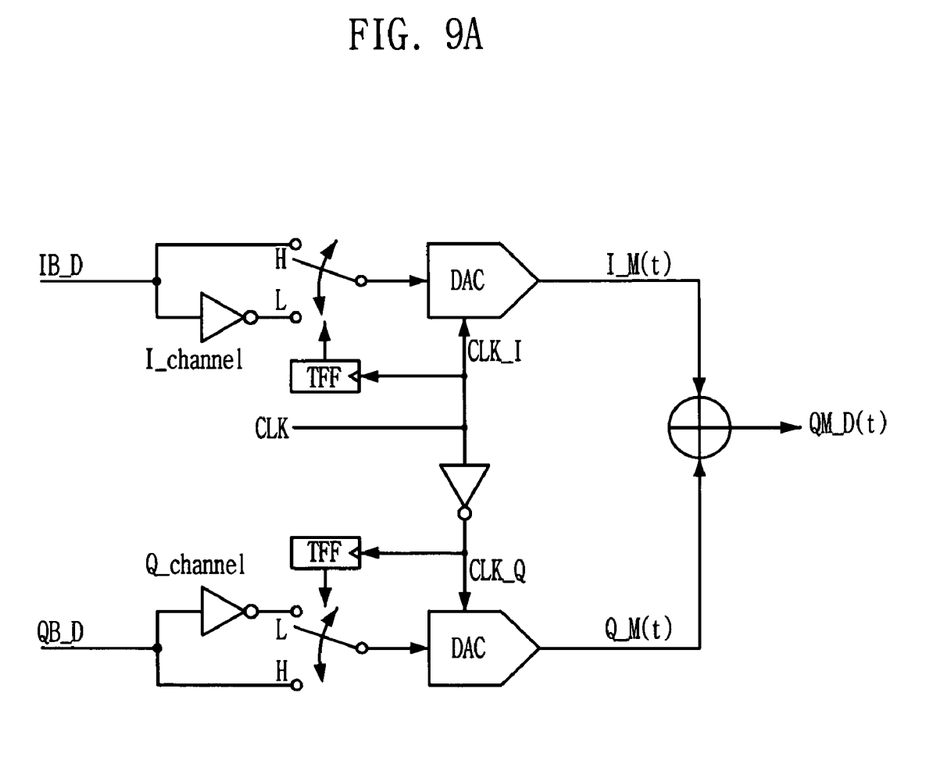
FIG. 9A is a block diagram illustrating a digital processing block of a quadrature modulation transmitter in accordance with an embodiment of the present invention.
Figure 9B:
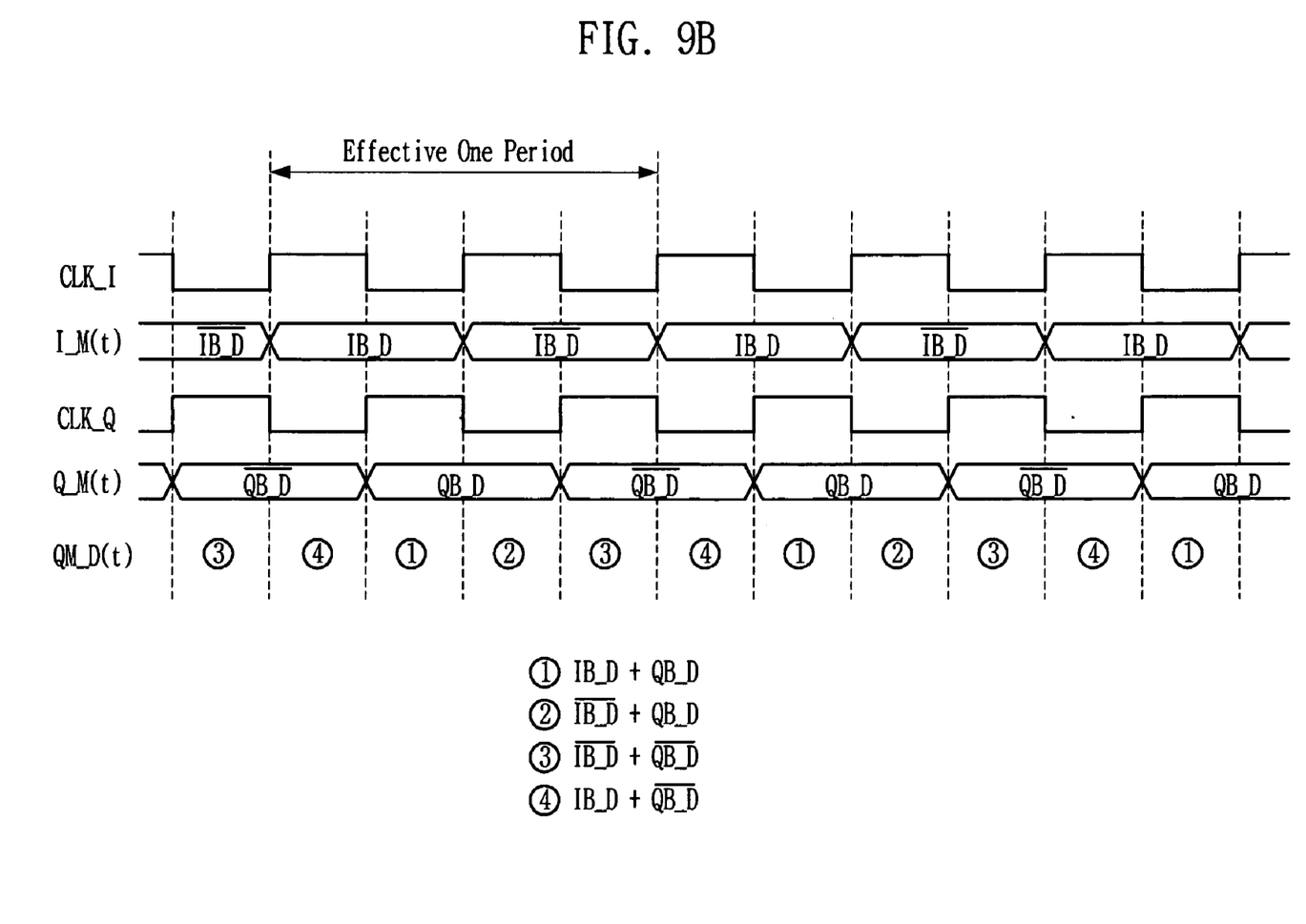
FIG. 9B is a timing chart illustrating an operation of a digital processing block of FIG. 9A.

FIG. 9A is a block diagram illustrating a digital processing block 410 of the quadrature modulation transmitter in accordance with an embodiment of the present invention, and FIG. 9B is a timing chart illustrating an operation of the digital processing block 410 of FIG. 9A.

The quadrature modulator capable of performing the digital-to-analog conversion and the quadrature modulation at the same time is referred to as a quadrature modulator DAC (QMDAC). Referring to FIG. 9A, the I-channel and the Q-channel are configured with the M-DAC described above and the operations of the respective channels are equal to that of the M-DAC. However, in case the quadrature modulator is implemented using the two M-DACs, the phase difference between the clocks inputted to the respective M-DACs occurs. In the case of the conventional analog quadrature modulator, the phase difference between the clocks of the I-channel and the Q-channel is 90°. On the contrary, in the case the quadrature modulator using the M-DAC, the clocks having the phase difference of 180° are supplied to the M-DACs of the I-channel and the Q-channel. The reason will be described below. In the quadrature modulator, the input signal is modulated into the frequency domain signal of the clock supplied to the quadrature modulator. Accordingly, in order for the quadrature modulation, the clocks supplied to the mixers of the respective channels must have the phase difference of 90° with respect to the modulation frequency. However, in the case of the M-DAC, the input signal is modulated into the frequency domain signal corresponding to half the clock frequency supplied to the M-DAC. Accordingly, in case the quadrature modulator is implemented using the M-DAC, the clocks having the phase difference of 90° with respect to the half the frequency ($f_{CLK}$) of the supplied clock must be supplied to the M-DACs of the I-channel and the Q-channel. Therefore, the clocks having the phase difference of 180° with respect to the frequency ($f_{CLK}$), that is, the clocks having the inverted relationship, must be applied to the M-DACs of the I-channel and the Q-channel. The relationships between the input signal and the clocks supplied to the respective channels of the quadrature modulation DAC and how to perform the quadrature modulation will be described with reference to FIG. 9B.

Additionally, as can be seen from FIG. 9A, the supplying of the clocks having the phase difference of 180° to the M-DACs of the I-channel and the Q-channel can be simply implemented using one inverter. On the contrary, in order to generate the clocks having the phase difference of 90°, the conventional quadrature modulator requires a considerably complicated circuit. This results in a relatively simple structure of the quadrature modulation DAC compared with the conventional analog mixer.

The gain mismatch and the phase mismatch between the I-channel and the Q-channel should not exist in the quadrature modulator. Meanwhile, in the case of the analog quadrature modulator, the digital-to-analog conversion is performed to the I-channel and Q-channel data and the converted data passes through the anti-aliasing filters and the analog mixers. Then, the two resulting signals are added to each other. Accordingly, there are many parts in which the gain mismatch and the phase mismatch may occur. However, in the quadrature modulation DAC in accordance with the present invention, the digital-to-analog conversion and the quadrature modulation are simultaneously performed to the I-channel and Q-channel data, thereby greatly reducing parts in which the gain mismatch or the phase mismatch may occur like the case of the analog mixer. As a result, the problems of the gain mismatch and the phase mismatch between the I-channel and the Q-channel are reduced relatively.

In other words, the quadrature modulation DAC capable of simultaneously performing the digital-to-analog conversion of the I-channel and Q-channel data, which are generated from the modem, by using the two M-DAC has a simple structure and consumes a low power compared with the present invention. Further, the gain mismatch and the phase mismatch are considerably decreased. The structure of the quadrature modulation DAC is essential in the quadrature modulation transmitter in accordance with the present invention.

Figure 10:
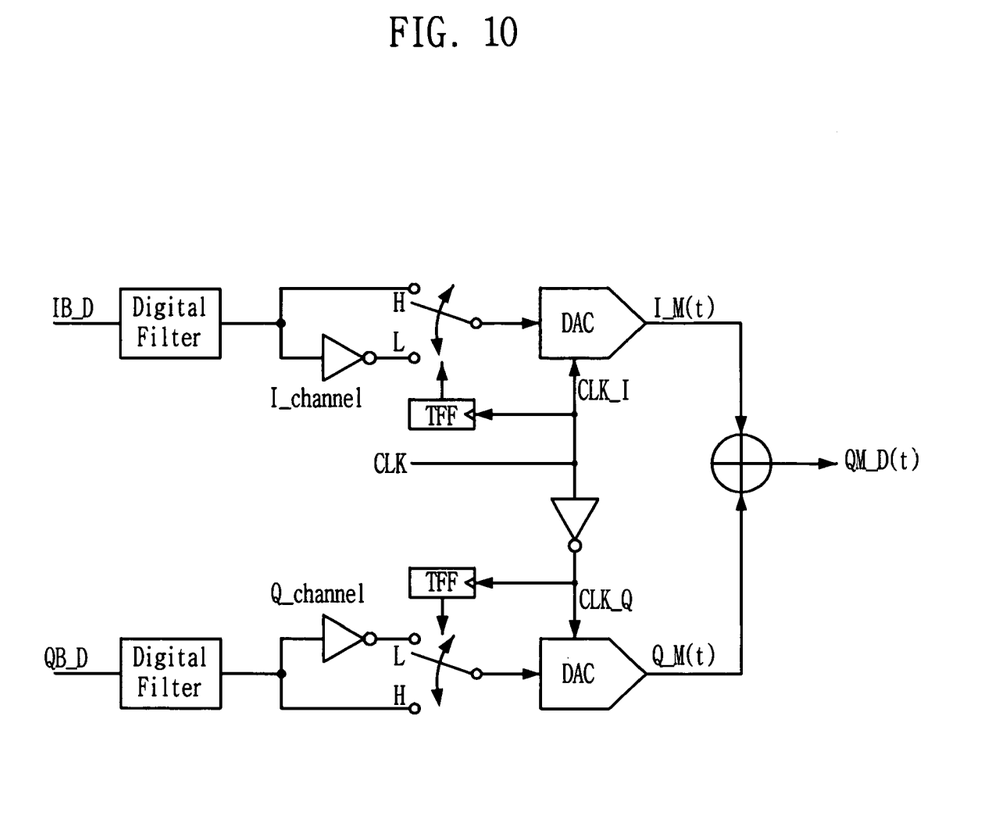
FIGS. 10 and 11 are exemplary diagrams of a system employing a quadrature modulation transmitter in accordance with an embodiment of the present invention.
Figure 11:
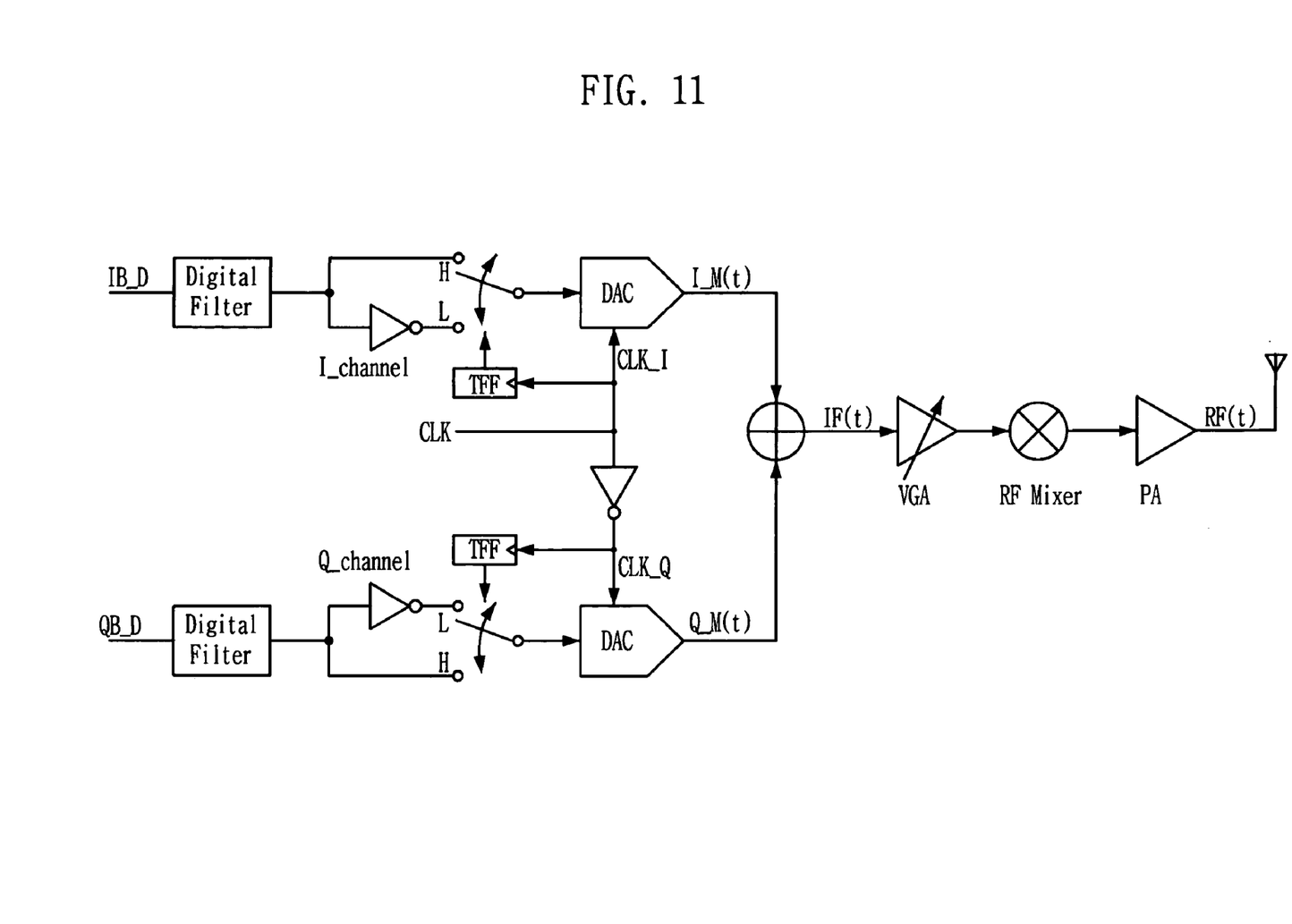

The quadrature modulation DAC in accordance with the present invention functions to modulate the digital data outputted from the modem into the intermediate frequency domain signal. Accordingly, the digital data outputted from the modem are also outputted according to this frequency. However, in the conventional modem, the intermediate frequency and the frequency of data outputted from the modem are different from each other. Consequently, the speed of digital data outputted from the modem needs to be matched with the intermediate frequency. For this reason, a digital filter for matching a conversion speed of the data outputted from the modem with the intermediate frequency is required between the modem and the quadrature modulation DAC. A structure of the quadrature modulator using the quadrature modulation DAC configured as above is shown in FIG. 10. Further, an overall structure of the transmitter using the quadrature modulator is shown in FIG. 11.

As described above, compared with the conventional heterodyne transmitter or the digital IF transmitter, the quadrature transmitter in according to the present invention can be implemented with a simple structure by using the quadrature modulation DAC. Further, the quadrature transmitter in accordance with the present invention can reduce the power consumption and solve problems of the gain mismatch and the phase mismatch. Furthermore, the quadrature transmitter in accordance with the present invention has an advantage that provides a variety of cheap and low-power mobile communication terminals.

While the present invention has been described with respect to the particular embodiments, it will be apparent to those skilled in the art that various changes and modifications may be made without departing from the scope of the invention as defined in the following claims.

What is claimed is:

1. A quadrature modulation transmitter comprising:
   a digital processing block for receiving an I-channel data, a Q-channel data and a clock signal, modulating the I-channel data or an inverted I-channel data into a first analog signal by means of an I-channel DAC according to a switching of an I-clock signal identical to the clock signal, and modulating the Q-channel data and an inverted Q-channel data into a second analog signal by means of a Q-channel DAC according to a switching of a Q-clock signal, the Q-clock signal being an inverted clock signal; and
   an analog processing block for receiving the first and second analog signals from the digital processing block, adding the first and second analog signals, converting the added signal into an RF domain signal through a mixing operation, and amplifying and transmitting the RF domain signal.

2. The quadrature modulation transmitter as recited in claim 1, wherein the digital processing block includes:
   a first inverter for inverting the I-channel data;
   a first T flip-flop for receiving the I-clock signal through a clock terminal and outputting a first switch control signal according to the I-clock signal;
   a first switch for turning on an output of the first inverter in case a output of the first T flip-flop is in a first logic level and for turning on the I-channel data in case the output of the first T flip-flop is in a second logic level;
   a first DAC for receiving the I-clock signal through a clock terminal, converting an output of the first switch into an analog signal and simultaneously performing a modulation;
   a second inverter for inverting the clock signal and outputting the resulting value as the Q-clock signal;
   a third inverter for inverting the Q-channel data;
   a second T flip-flop for receiving the Q-clock signal through a clock terminal and outputting a second switch control signal according to the Q-clock signal;
   a second switch for turning on an output of the third inverter in case an output of the second T flip-flop is in a first logic level and for turning on the Q-channel data in case the output of the second T flip-flop is in a second logic level; and
   a second DAC for receiving the Q-clock signal through a clock terminal, converting an output of the second switch into an analog signal and simultaneously performing a modulation.

3. The quadrature modulation transmitter as recited in claim 1, further comprising a digital filter for matching a conversion speed of I-channel and Q-channel digital data outputted from a modem with an intermediate frequency and outputting the resulting data as the I-channel and Q-channel data to the digital processing block.

* * * * *